(12) United States Patent
Su

(10) Patent No.: US 6,701,177 B2
(45) Date of Patent: Mar. 2, 2004

(54) FLEXIBLE, REGION-SELECTABLE INHERENTLY DE-COUPLED SANDWICHED SOLENOIDAL ARRAY COIL

(75) Inventor: Sunyu Su, South San Francisco, CA (US)

(73) Assignee: Toshiba America MRI, Inc., Tustin, CA (US)

( * ) Notice: Subject to any disclaimer, the term of this patent is extended or adjusted under 35 U.S.C. 154(b) by 0 days.

(21) Appl. No.: 10/283,213

(22) Filed: Oct. 30, 2002

(65) Prior Publication Data

US 2003/0114748 A1 Jun. 19, 2003

Related U.S. Application Data

(62) Division of application No. 09/408,506, filed on Sep. 30, 1999, now Pat. No. 6,493,572.

(51) Int. Cl.$^7$ ............................................... A61B 5/055
(52) U.S. Cl. ....................................... 600/422; 324/318
(58) Field of Search ................................. 600/421, 422; 324/318, 322

(56) References Cited

U.S. PATENT DOCUMENTS

| | | |
|---|---|---|
| 2,220,070 A | 11/1940 | Aiken |
| 2,451,596 A | 10/1948 | Wheeler |
| 3,826,973 A | 7/1974 | Pflaum |
| 4,093,910 A | 6/1978 | Hill |

(List continued on next page.)

OTHER PUBLICATIONS

Carlson, J. W. et al., "Imaging Time Reduction through Multiple Receiver . . . ", Magnetic Resonance in Medicine, vol. 29, 1993, pp. 681–687.

Hoult, D. I. et al., "Quadrature Detection in the Laboratory Frame", Magnetic Resonance in Medicine, vol. 1, 1984, pp. 339–353.

Roemer, P. B. et al., "The NMR Phased Array", Magnetic Resonance in Medicine, vol. 16, 1990, pp. 192–225.

Takahashi, T. et al., "Four–Channel Wrap–Around Coil with Inductive Decoupler . . . ", Society of Magnetic Resonance in Medicine Annual Meeting Proceedings, 1996, p. 1418.1.

Takahashi, T. et al., "Head–Neck Quadrature Multiple RF Coil . . . ", Society of Magnetic Resonance in Medicine Annual Meeting Proceedings, 1997, p. 1521.

Primary Examiner—Shawna J. Shaw
(74) Attorney, Agent, or Firm—Nixon & Vanderhye, P.C.

(57) ABSTRACT

An inherently de-coupled sandwiched solenoidal array coil (SSAC) is disclosed for use in receiving nuclear magnetic resonance (NMR) radio frequency (RF) signals in both horizontal and vertical-field magnetic resonance imaging (MRI) systems. In its most basic configuration, the SSAC comprises two coaxial RF receive coils. The first coil of the array has two solenoidal (or loop) sections that are separated from one another along a common axis. The two sections are electrically connected in series but the conductors in each section are wound in opposite directions so that a current through the coil sets up a magnetic field of opposite polarity in each section. The second coil of the SSAC is disposed ("sandwiched") between the two separated solenoidal sections of the first coil in a region where the combined opposing magnetic fields cancel to become a null. Due to the winding arrangement and geometrical symmetry, the receive coils of the array become electromagnetically "de-coupled" from one another while still maintaining their sensitivity toward receiving NMR signals. The multiple coil array arrangement also allows for selecting between a larger or smaller field-of-view (FOV) to avoid image fold-over problems without time penalty in image data acquisition. Alternative embodiments are disclosed which include unequal constituent coil diameters, unequal constituent coil windings, non-coaxial coil configurations, a three-coil quadrature detection (QD) SSAC arrangement, multiple SSAC arrangements, and optimized SSAC configurations for breast imaging in both horizontal and vertical-field MRI systems.

4 Claims, 14 Drawing Sheets

U.S. PATENT DOCUMENTS

| | | | |
|---|---|---|---|
| 4,620,155 A | 10/1986 | Edelstein | |
| 4,636,730 A | 1/1987 | Bottomley | |
| 4,658,229 A | 4/1987 | Chen et al. | |
| 4,680,549 A | 7/1987 | Tanttu | |
| 4,724,389 A | 2/1988 | Hyde et al. | |
| 4,739,271 A | 4/1988 | Haase | |
| 4,752,738 A | 6/1988 | Patrick et al. | |
| 4,825,162 A | 4/1989 | Roemer et al. | |
| 4,857,846 A | 8/1989 | Carlson | |
| 4,857,850 A | 8/1989 | Mametsa et al. | |
| 4,887,039 A | 12/1989 | Roemer et al. | |
| 4,918,388 A * | 4/1990 | Mehdizadeh et al. | 324/322 |
| 4,920,318 A * | 4/1990 | Misic et al. | 324/318 |
| 4,996,481 A | 2/1991 | Ackerman et al. | |
| 5,028,872 A * | 7/1991 | Nakabayashi | 324/318 |
| 5,041,791 A | 8/1991 | Ackerman et al. | |
| 5,168,230 A | 12/1992 | Hashoian et al. | |
| 5,192,911 A | 3/1993 | Hill et al. | |
| 5,278,505 A | 1/1994 | Arakawa | |
| 5,327,898 A * | 7/1994 | Yoshino et al. | 600/422 |
| 5,578,925 A | 11/1996 | Molyneaux et al. | |
| 5,592,088 A | 1/1997 | Matsunaga et al. | |
| 5,602,479 A | 2/1997 | Srinivasan et al. | |
| 5,680,047 A | 10/1997 | Srinivasan et al. | |
| 5,951,474 A | 9/1999 | Matsungaga et al. | |
| 6,265,876 B1 | 7/2001 | Carrozzi | |
| 6,326,789 B1 | 12/2001 | Yoshida et al. | |
| 6,377,836 B1 | 4/2002 | Arakawa et al. | |
| 6,493,572 B1 | 12/2002 | Su et al. | |

* cited by examiner

FLEXIBLE, REGION-SELECTABLE INHERENTLY DE-COUPLED SANDWICHED SOLENOIDAL ARRAY COIL

This application is a Divisional of application Ser. No. 09/408,506, filed Sep. 30, 1999 now U.S. Pat. No. 6,493,572, the entire content of which is hereby incorporated by reference in this application.

FIELD OF THE INVENTION

This invention relates generally to methods and apparatus for magnetic resonance imaging. In particular, it relates to an electromagnetically de-coupled sandwiched solenoidal array coil for receiving radio frequency magnetic resonance signals in an MRI apparatus.

BACKGROUND AND SUMMARY OF THE INVENTION

Based on principals of nuclear magnetic resonance (NMR), magnetic resonance imaging (MRI) has become a widely accepted medical imaging modality—having evolved tremendously over the last two decades as an important clinical technique for obtaining visual images of tissues and organ structures within the human body. Basically, clinical MRI relies on the detection of NMR signals from abundant hydrogen protons in the human body. These protons are first subjected to a strong radio frequency (RF) electromagnetic wave excitation pulse. If the frequency of the excitation pulse is properly chosen, the protons receive needed RF energy to make a transition to an excited state. Eventually, the excited protons give up their excess energy via a decay process, commonly known as "relaxation", and return to their original state.

Since the magnetic moment of a proton is a vector quantity, the microscopic behavior of millions of protons considered together is equivalent to the vector sum of the individual magnetic moments of all the protons. For convenience, this sum is typically represented as a single resultant magnetization vector, $M_0$, that is aligned with $\vec{B}_0$ (the static main magnetic field). The strong RF excitation pulse used in MRI effectively tips this resultant magnetization vector away from alignment with the static main field $\vec{B}_0$ and causes it to precess before decaying back to an equilibrium alignment with $\vec{B}_0$. The component of this precessing resultant magnetization vector in a plane perpendicular to $\vec{B}_0$ induces an RF signal, referred to as the nuclear magnetic resonance (NMR) signal, in an RF "pick-up" or "receive" coil(s) placed near the body portion containing the excited protons.

During clinical MRI, the magnetic resonance of protons in different tissues within an anatomical region are made distinguishable through the evocation of a magnetic field gradient along each of three mutually orthogonal spatial directions—the effect of which is to cause protons at different spatial locations to have slightly different nuclear magnetic resonance frequencies. The NMR signals induced in the receive coil can then be processed to reconstruct images of the anatomical structure of interest (i.e., images of the spatial distribution of NMR nuclei which, in many respects, conform to the anatomical structures containing such nuclei).

To obtain the maximum induced signal in a receive coil, the magnetic field of the receive coil—conventionally designated as $\vec{B}_1$—must be oriented perpendicular to the direction of the static main magnetic field ($\vec{B}_0$) of the MRI apparatus. For a planar-loop (i.e., a substantially flat loop) type receive coil, that direction is in a direction normal to the plane of the conductive loop(s) of the coil. For a quadrature detection (QD) type coil—which basically consists of two RF receive coils having mutually perpendicularly oriented $\vec{B}_1$ fields—must also have the $\vec{B}_1$ fields of both of its coils oriented perpendicular to the MRI apparatus static field $\vec{B}_0$ to obtain a maximum induced signal.

Due to the unique nature of the clinical MRI environment, there are certain design considerations that are particularly relevant toward obtaining maximum performance from an RF receive coil. For example, the NMR signals induced in an RF receive coil during magnetic resonance imaging are nominally on the order of nanovolts in magnitude while the background ambient electrical noise may be of comparable levels or higher. Therefore, a high performance RF receive coil for clinical MRI needs to be electromagnetically "sensitive" enough to detect the low level NMR signals despite the relatively high levels of background electrical noise. Moreover, other design considerations such as field-of-view, uniformity (i.e., uniformity of the magnetic field generated by the coil) and coil efficiency are also highly relevant to coil performance in the clinical MRI environment X coil uniformity because it can affect image interpretation and coil efficiency because a highly efficient coil allows the same image signal information to be acquired within a shorter time frame.

Theoretical analysis and experimental results have indicated that for many MRI applications using multiple RF receive coils together as a signal receiving array is advantageous for improving coil sensitivity, signal-to-noise ratio and imaging field-of-view. Conventionally, the imaging "field-of-view" (FOV) for an MRI receive coil is defined as the distance indicated between two points on the coil sensitivity profile (i.e., a graph of coil sensitivity vs. distance profile) where the signal drops to 80% of its peak value. In a typical MRI receive coil array arrangement, instead of using a single large FOV but less sensitive coil that covers the entire imaging volume of interest, multiple small FOV but sensitive coils are distributed as an array over the entire imaging volume. Each individual coil of the array covers a small localized volume and the NMR signals received by each coil are simultaneously acquired through corresponding data acquisition channels. Signals from each of the channels are then appropriately combined and processed to construct an image of the complete volume of interest. Due to this ability to simultaneously acquire a signal from multiple sources (i.e., multiple coils) and since each individual signal channel is provided with its own associated detection circuitry, an array type coil can conceivably operate with high efficiency. However, the simultaneous acquisition of a signal from a plurality of individual receive coils necessitates that each coil function independently, free of interaction or coupling.

As two individual coils having the same resonance frequency are brought in close proximity to each other, the common resonance frequency starts to split into two separate frequencies due to the electromagnetic interaction or "coupling" between the coils. Generally, the closer the coils are brought together, the stronger the interaction and the larger the frequency split. Since an MRI receive coil should have its maximum sensitivity optimized for a particular relatively narrow band of frequencies, the resonance frequency splitting can cause sensitivity degradation when two or more receive coils are closely arranged in an array.

Generally, MRI systems are categorized as either a horizontal field type or vertical field type, based on the direction of the static main magnetic field. In a horizontal field system, the static main magnetic field is typically oriented in a superior-inferior direction relative to a patient laying in a prone/supine position. In a vertical field MRI system, the static main magnetic field is oriented in an interior-posterior direction relative to a prone/supine patient. This difference in main field orientation is important in that it affects the ultimate placement and configuration of an RF receive coil(s) used for diagnosis in such systems. More often than not, a receive coil designed specifically for use in a horizontal field system will not be suitable for similar use in a vertical field system and vice versa.

Consequently, horizontal field MRI systems and vertical field MRI systems typically require radically different RF receive coil configurations to obtain the maximum achievable performance from the coil. For example, a planar-loop type receive coil configuration designed for obtaining images of a the human spine works well in a horizontal field MRI system when placed in posterior contact with the back of a patient in supine position. However, the same coil configuration may not work in a vertical field system because, in that case, the RF magnetic field, $\vec{B}_1$, of the receive coil (i.e., the direction normal to the plane of the loop) is oriented parallel, rather than being perpendicular, to the direction of the static main magnetic field $\vec{B}_0$.

Likewise, a coplanar loop type array coil is fairly effective in horizontal-field MRI systems but is rather ineffective in vertical-field MRI systems. In a coplanar loop type array coil, the planar-loop receive coils are arranged in a basically coplanar fashion and distributed over the imaging volume of interest. Each individual receive coil in a coplanar loop type array is typically a relatively small but highly sensitive RF coil that receives NMR signals from a specific small portion of the entire region of interest. A final composite image is constructed by combining signals obtained from each of the individual coils.

Magnetic interaction between adjacent coils can be analyzed in terms of induced current, induced EMF or magnetic flux. For the purpose of this discussion, a magnetic flux representation is most convenient. In this representation, two coils in close proximity are considered to "couple" to one another if one coil induces a net nonzero magnetic flux linkage to the other, and vice versa. Likewise, two coils are considered to be magnetically "de-coupled" if one coil induces a net zero magnetic flux linkage to the other. Consequently, by definition, a complete nulling of the magnetic flux linkage between coils in an array effectively "de-couples" the individual coils from one another.

Since it has become known that magnetic coupling between adjacent elemental coils in a coplanar loop type array coil can be effectively nulled by properly overlapping the constituent elemental coils (see, for example, "The NMR Phased Array", P. B. Roemer et al., Magnetic Resonant Medicine, 1990, 16, pp.192–225), various methods and schemes for overlapping the elemental coils have contributed toward making coplanar array coils practical and popular for use in horizontal-field MRI systems. Unfortunately, the coplanar array coils have not been used successfully in vertical-field MRI systems. Although adapting a coplanar array coil configuration to a vertical-field MRI system has been attempted by others, such array coils typically have poor signal—primarily due to the constraint that the normal to the of plane constituent coils (i.e., the direction of the $\vec{B}_1$ field) must be positioned perpendicular to the $\vec{B}_0$ static field of the MRI apparatus to obtain the maximum induced signal.

In an attempt to address this problem, various modifications to the basic coplanar coil array configuration have been proposed by others—the more familiar modifications being the so-called "FIG. 8" array coil and its variations. Nonetheless, known prior art attempts to utilize a coplanar array coil or its variants in a vertical-field MRI system have resulted in severe limitations in terms of coil sensitivity, imaging depth and uniformity over the desired region of interest.

SUMMARY OF THE INVENTION

The inventors of the present invention realized that a solenoidal type coil has many inherent characteristics that make it particularly advantageous for use in vertical-field MRI systems. For example, solenoid type coils inherently have high sensitivity and uniformity. In addition, the cylindrical shape of the coil fits naturally over various parts of the body such as the head, neck and other extremities and for clinical MRI applications in a vertical-field system, the $B_1$ field of a solenoidal type coil when fitted to a patient laying horizontal will be oriented perpendicular to the vertical magnetic field—as required for maximizing the induced signal strength.

Although it is has been suggested by others that two solenoidal coils be used in a sandwiched arrangement within an NMR spectrometer to achieve mutual isolation between two coils (see U.S. Pat. No. 4,093,910 to Hill, issued Jun. 6, 1978), the two coils comprising this sandwiched arrangement are not used together to form a single RF receiving "array" type antenna for the purpose of obtaining an increase in antenna sensitivity or FOV to provide improved image quality for MRI. Specifically, in the NMR spectrometer, one coil is used as a control channel RF resonance pick-up coil and the other is used as a sample analysis resonance pick-up coil. Moreover, the spectrometer coils are each separately tuned to be responsive to different resonant frequencies (i.e., one coil is tuned for the sample under analysis and the other coil is tuned for a control nuclei, e.g., 2D or 19F). In contrast, a receive coil or receive array coil designed for MRI applications should have its maximum sensitivity optimized for a single relatively narrow band of frequencies.

Accordingly, one general feature of the present invention is an inherently de-coupled array type receive coil having high efficiency, high sensitivity and good uniformity for use in both horizontal and vertical-field MRI systems. The present invention also provides an array type receive coil that can be used in both horizontal and vertical-field MRI systems to provide an enlarged composite field-of-view (FOV) compared to conventional MRI receive coils. The novel array type receive coil can be used in horizontal or vertical-field MRI systems to provide a capability for allowing selection between different sized FOVs and/or imaging regions. It also provides an array type receive coil that can be used in horizontal or vertical-field MRI systems and which can be readily adapted to fit one or more disparate size portions of the human anatomy.

The present invention provides novel RF receive coil array arrangements for enhancing the magnetic resonance imaging of one or more portions of the human anatomy. In particular, the present invention provides an inherently magnetically de-coupled array coil for use in magnetic resonance imaging (MRI) systems. The basic array coil structure of the present invention provides an enhanced signal-to-noise ratio for improved image quality and a selectable field-of-view (FOV) in both horizontal and vertical-field MRI environments. Specifically, the present invention utilizes a field-bucking "sandwiched" array coil arrangement that precludes magnetic coupling between constituent coils of the array while providing increased sensitivity and uniformity over conventional MRI receive coil arrangements.

In its most basic configuration, the sandwiched array coil of the present invention is an array of radio frequency (RF) sensitive coils comprising at least two solenoidal type RF receive coils arranged such that one coil antenna is coaxially surrounded or "sandwiched" between two axially separated solenoidal sections of the second coil, with conductor winding directions being opposite in each of the separated sections of the second coil. Because of this "sandwiched" structural configuration and the peculiar opposite (field-bucking) winding arrangement, the two RF coils of the array are inherently magnetically "de-coupled" from one another.

Accordingly, one embodiment of the present invention is a basic sandwiched solenoidal array coil (SSAC) comprising two same-diameter coaxial solenoidal RF coils, each coil having one or more conductive windings, including an inner coil and an outer coil surrounding the inner coil, the outer coil having separated sections with the conductor winding directions being opposite in each of the separated sections so as to create a magnetic field bucking arrangement at the position of the inner coil.

Another embodiment of the present invention is a sandwiched solenoidal array coil (SSAC) having two non-coaxial, unequal-diameter receive coils adaptable to fit portions of the human anatomy. An arrangement for using the SSAC for breast imaging in a vertical-field MRI systems for an example non-coaxial, unequal-diameter sandwiched array coil embodiment is disclosed.

In a third embodiment of the present invention, a sandwiched solenoidal array coil (SSAC) is formed wherein the constituent gradient-field coil of the array has solenoidal sections of unequal diameter and a correspondingly different number of conductive windings in each section.

In a fourth embodiment of the present invention, a sandwiched solenoidal array coil (SSAC) having constituent coils of same or different diameters is adapted for imaging the female breast in a horizontal-field MRI apparatus.

In a fifth embodiment of the present invention, a multiple sandwiched solenoidal array coil (SSAC) apparatus is provided for obtaining region-selectable images of the entire human torso.

In a sixth embodiment of the present invention, a quadrature detection type sandwiched solenoidal array coil is provided for which different data channel acquisition arrangements are shown.

DETAILED DESCRIPTION OF EXEMPLARY EMBODIMENTS

Figure 1:
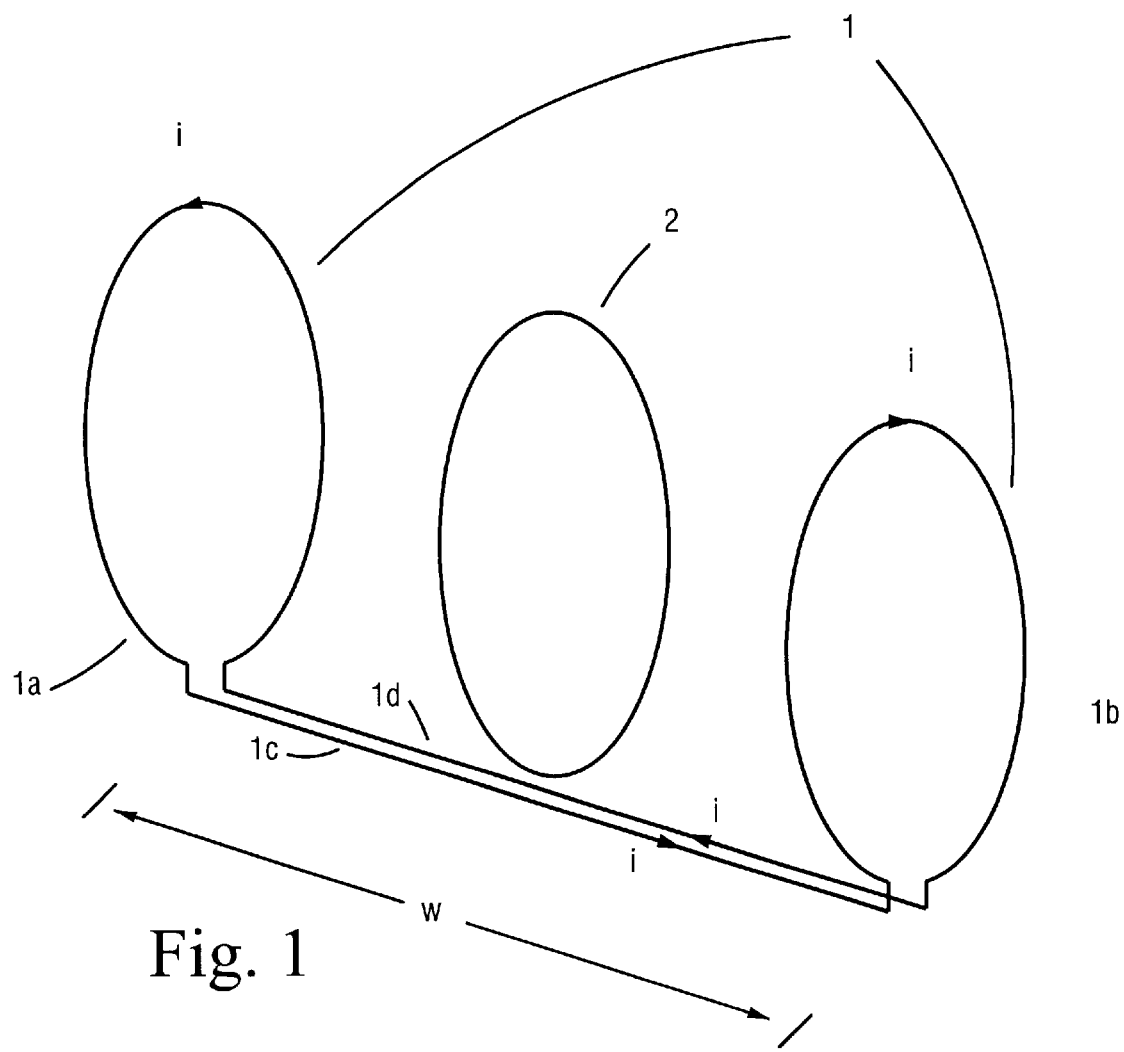
FIG. 1 is a schematic diagram illustrating the basic configuration of a sandwiched solenoidal array coil in accordance with the present invention.

A diagrammatic representation of the basic sandwiched solenoidal array coil (SSAC) for receiving NMR signals in accordance with the present invention is shown in FIG. 1. In this basic two-coil embodiment of the present invention, receive coil 1 consists of two loop or solenoidal sections 1a and 1b that are spatially separated by a distance W. The two loop or solenoidal sections may consist of either single or multiple conductive windings (turns) and are electrically connected by a pair of parallel conductors, 1c and 1d, such that an electrical current (i) in coil 1 flows clockwise in section 1b but counterclockwise in section 1a (or vice versa).

On its own, the structure of coil 1 is sometimes referred to as a "gradient-field" coil arrangement because the composite magnetic field generated by the two separated sections changes in magnitude (substantially linearly) as a gradient between the two sections. In accordance with the present invention, receive coil 2, which also may be a single-turn loop or a multiple-turn solenoid, is "sandwiched" between sections 1a and 1b of this gradient-field arrangement of coil 1 to form an RF coil array. The separated sections of coil 1 are electrically connected and positioned so that a current in coil 1 flows in opposite circumferential directions through the conductive winding(s) in sections 1a and 1b such that magnetic fields generated from sections located at opposite sides (axial ends) of the coil 2 achieve a null at the location of coil 2. This particular structural configuration provides an inherent "decoupling" of the two coils when used together as an array for receiving NMR signals, as discussed in greater detail below.

FIGS. 2A–2E show graphs of the $\vec{B}_1$ magnetic field distribution and sensitivity profile for each coil of the sandwiched array, individually, and for the array as a whole. Although $B_1$ field and coil sensitivity are two different quantities, they are related. Coil sensitivity represents the ability of a coil in receiving NMR signal from a spatial location, whereas $B_1$ field is the magnetic field generated at the same spatial location due to unit current flowing in the coil. The reciprocity principle assures these two effects are proportional (see C-N. Chen et al., "Biomedical Magnetic Resonance Technology", published by Institute of Physics Publishing Iop Iopp Hilger, 1989).

Figures 2A, 2B:
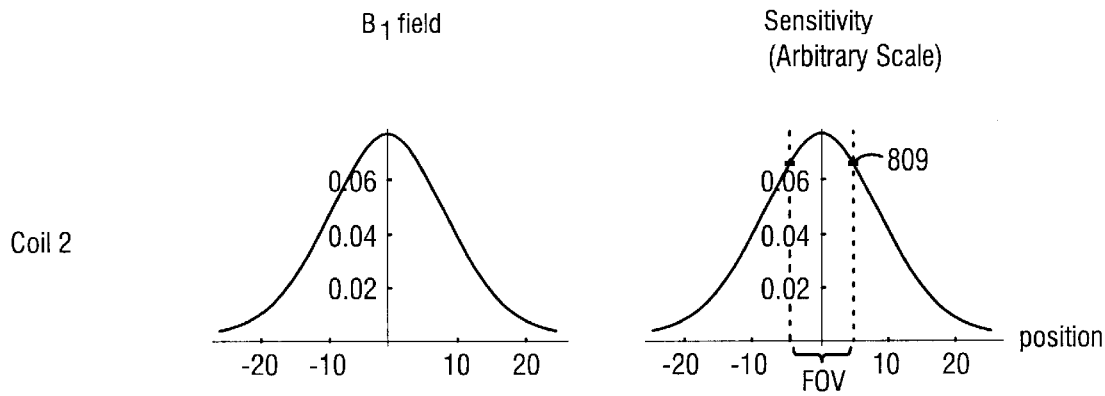
FIGS. 2A–2E are graphs depicting the $\vec{B}_1$ field distributions and the corresponding sensitivity profile for the individual and combined receive coils of the basic sandwiched solenoidal array coil of FIG. 1.

As depicted in FIG. 2A, the $\vec{B}_1$ field generated by coil 2 along its longitudinal axial direction, reaches a maximum field strength at the center of coil 2 and drops off as the distance increases away from the coil center. Since the magnitude of the $\vec{B}_1$ field of a coil is indicative of coil sensitivity, a spatial distribution of the sensitivity of a coil will have the same general shape as indicated by a graph of the $\vec{B}_1$ field for that coil. As corroborated by the graph of the spatial sensitivity of coil 2 shown in FIG. 2B, coil 2 also has its greatest sensitivity very much localized about its center (i.e., where the $\vec{B}_1$ field strength for that coil is maximum).

As indicated in FIG. 2B, the distance measured between two points on the coil sensitivity profile where a received NMR signal drops to 80% of its value is, conventionally defined as the 80% field-of-view (FOV) of the coil. Because it is necessary to have a fairly uniform distribution of coil sensitivity over an area to be imaged to insure a uniform signal reception from each point in the imaged area, it is generally desirable to have the entire region of interest completely within the FOV of the coil.

Figures 2C, 2D:
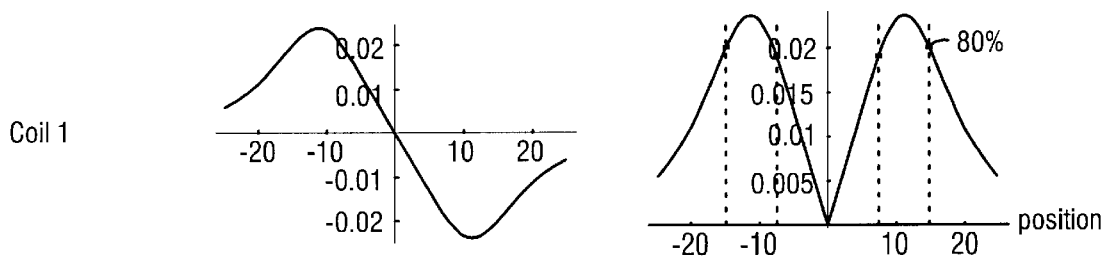

Referring now to FIG. 2C, it can be seen that coil 1 has a very different $\vec{B}_1$ field distribution along the central axis compared to coil 2. At the center of coil 1 and the middle of coil 2, the $B_1$ fields generated by the two sections, 1a and 1b, of coil 1 are equal and opposite—as a result of current flowing in opposite direction in each section—and therefore cancel each other. The $\vec{B}_1$ field changes sign (direction) at this middle point and increases in strength toward solenoidal (loop) end sections 1a and 1b. (This type of field distribution is commonly referred to as a "gradient-field" as it changes in magnitude at a substantially linear, constant rate between two points in space.) Since the sign of the $B_1$ field affects only the phase of the received NMR signal, it is the signal magnitude rather than the phase information that is reflected in an MRI magnitude image. In other words, it is the magnitude of the $\vec{B}_1$ field that determines coil sensitivity. Consequently, the sensitivity of a gradient-field coil, such as coil 1, will have an "M" shape profile as evident in FIG. 2D (i.e., two sensitivity "maximums" corresponding to the two positions of each solenoidal end section, along with a "null" coil sensitivity in the middle).

Figure 2E:
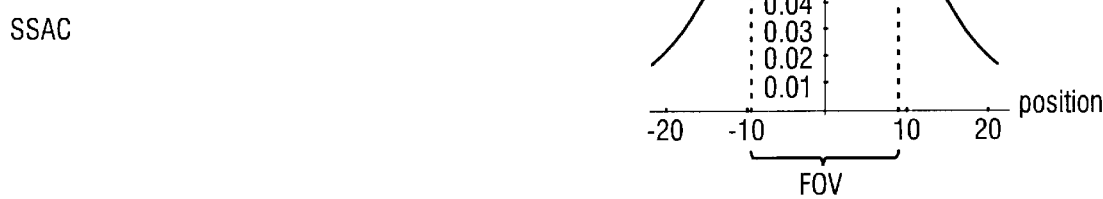

When coils 1 and 2 are combined to form a sandwiched array, the resultant signal strength can be weighted average of the individual signals acquired from each coil. Likewise, the sensitivity profile of each coil combines accordingly to produce an overall sensitivity profile from which an FOV for the sandwiched array can be derived. In FIG. 2E, a graph of sensitivity versus axial position for coil 1 and coil 2 combined together as a sandwiched array is depicted. It can be seen from this graph that the sandwiched array coil has an enlarged FOV in comparison with coil 2 alone.

Figure 3A:
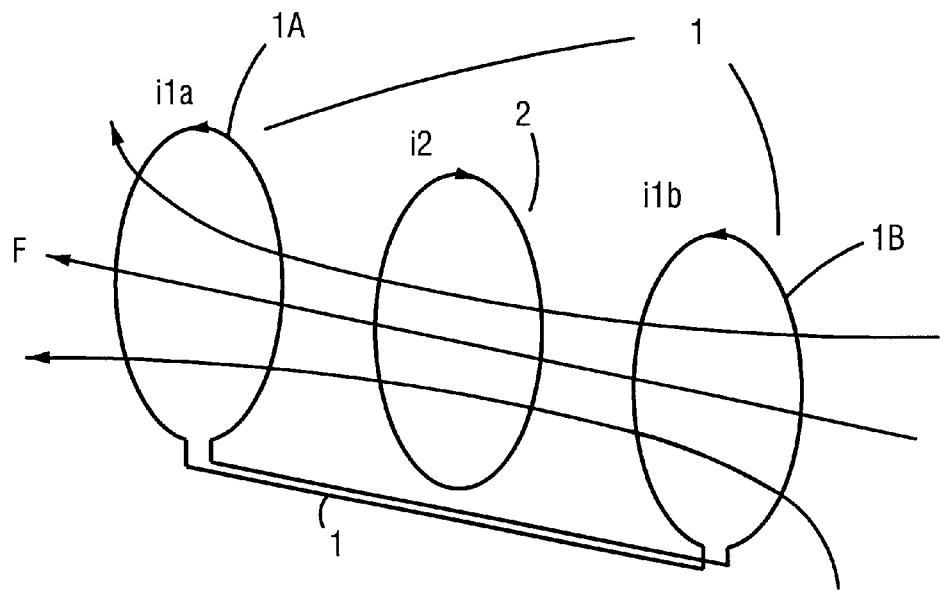
FIGS. 3A–3B are schematic diagrams illustrating the magnetic flux linkage between constituent coils of the basic sandwiched solenoidal array coil of the present invention.
Figure 3B:
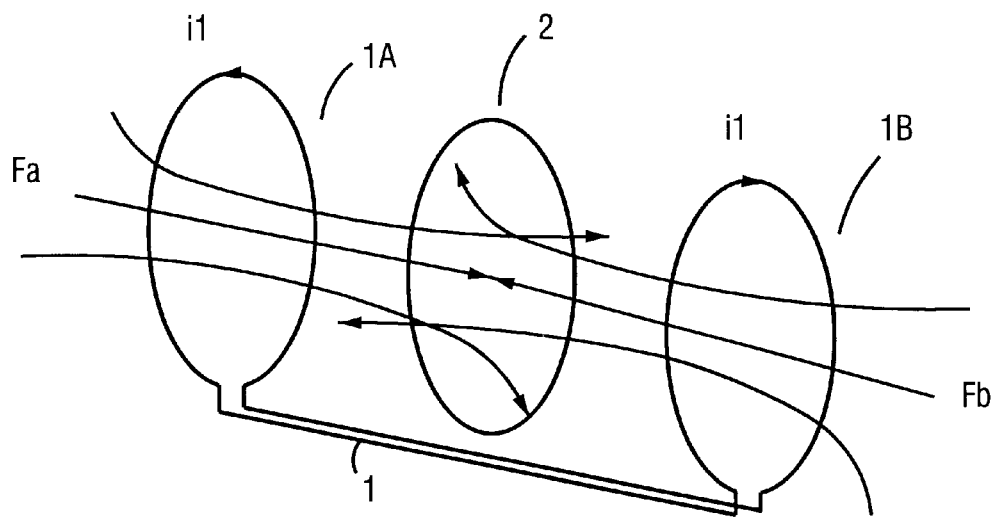

Referring now to FIGS. 3A and 3B, the magnetic coupling between the coils of the basic SSAC is discussed. For this purpose, it is convenient to analyze the coils in terms of magnetic flux representative of the magnetic fields from individual sections. Considering first the center "sandwiched" coil 2 of the SSAC, FIG. 3A illustrates the magnetic field, represented by flux lines F, generated by a current flow, i2, flowing in coil 2. Since this magnetic field passes through both loop (or solenoidal) sections 1a and 1b of coil 1, the net magnetic flux linkage to coil 1 from coil 2 is the sum of the flux linkage to both section 1a and section 1b. Moreover, since sections 1a and 1b are geometrically symmetrical with respect to coil 2, the flux linkage to each section is equal in magnitude but opposite in sign. Consequently, the net magnetic flux linkage to coil 1 is zero.

The above analysis is corroborated by considering the current induced in sections 1a and 1b of coil 1 by magnetic flux F. Since an induced current opposes changes in magnetic flux, a current (i1a) induced in coil section 1a by magnetic flux F and a current (i1b) induced in coil section 1b by the same magnetic flux each flow in the same relative spacial direction within the individual coil sections. However, due to the opposite conductor winding direction in each section, the induced current from each section flows in opposite directions within the coil as a whole and therefore cancels. As both of the preceding methods of analysis confirm, a current flow in coil 2 induces no net current flow in coil 1 through magnetic coupling.

Similarly, referring now to FIG. 3B, if a current 1 is assumed to flow through coil 1, it is evident that current i1 flows clockwise (relatively speaking) in a first coil section 1b and counterclockwise in a second coil section 1a. Whereas current i1 flowing in section 1a generates a magnetic field indicated by flux Fa, the same current i1 flowing in section 1b generates a magnetic field indicated by flux Fb; and the linkage of magnetic flux from coil 1 to coil 2 will be the sum of the magnetic flux contributed by both coil sections 1a and 1b at the location of coil 2. However, since magnetic flux Fa and Fb are equal in magnitude and opposite in direction at the central "sandwiched" location of coil 2, the two cancel and the total net flux linkage to coil 2 is zero. Thus, a current flowing in coil 1 induces no net current in coil 2 via magnetic coupling.

As evidenced by the preceding discussion with respect to FIGS. 3A and 3B, an analysis of magnetic flux linkage within the basic SSAC between constituent coils demonstrates that, due to the geometrical symmetry and the conductor winding configuration, the two coils are effectively "de-coupled" from one another. Although, in practice coil dimensions and alignment imperfections may result in a slight non-zero net flux linkage, the magnitude of such residual coupling is small and is easily compensated using conventional decoupling techniques such as a simple capacitor de-coupling network.

Figure 4:
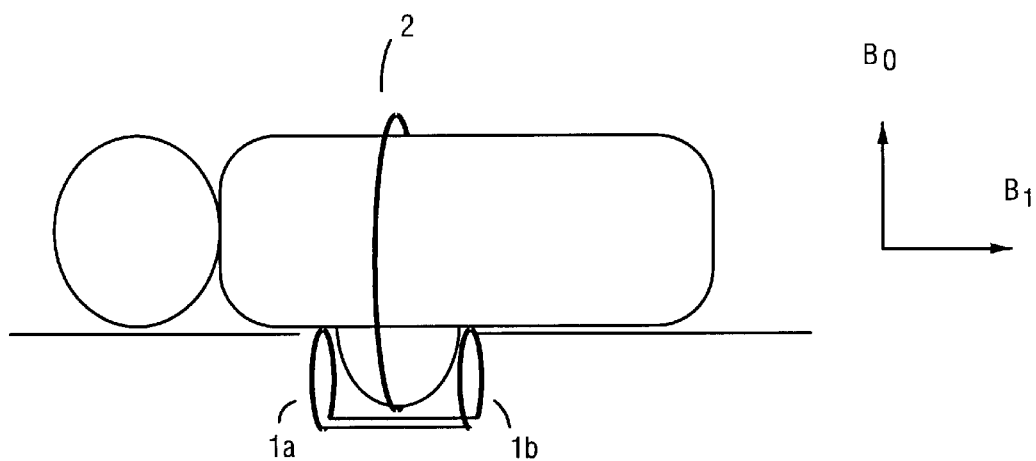
FIG. 4 is a schematic diagram illustrating a non-coaxial, unequal-diameter sandwiched solenoidal array coil used for breast imaging in a vertical field MRI system in accordance with an alternate embodiment of the present invention.

FIGS. 4–7 diagramatically illustrate example structural configurations and some methods of application for four different SSAC embodiments in accordance with the present invention. In a first embodiment, illustrated in FIG. 4, the two RF receiving coils comprising the basic SSAC are non-coaxially arranged and each has a different diameter. FIG. 4 shows an applied example of this particular embodiment wherein the SSAC of the present invention is configured for imaging a human breast of a prone patient in a vertical-field MRI system (as indicated by the directional vectors at the left of the illustration). Despite the non-coaxial configuration and the different diameters, the electromagnetic analysis discussed above with respect to the basic SSAC (shown in FIGS. 3A and 3B) applies in this case with identical results and the two coils can be shown to be electromagnetically "de-coupled."

As illustrated in FIG. 4, the SSAC basically consists of a large diameter single-loop or solenoidal coil 2 sandwiched between single-loop or solenoidal sections 1a and 1b of a small diameter coil 1. The larger diameter coil 2 is placed surrounding both the breast and the torso while the smaller diameter sections of coil 1 are preferably positioned "sandwiching" both the breast and coil 2. With this configuration, the SSAC obtains complete coverage of the breast as well as providing deep penetration for signal sensitivity into the chest wall. In a more accessorized embodiment (not shown here), coil 2 may be constructed of flexible conductors' and provided with a separable connector along its top portion, such as a conductive buckle or the like, for convenient patient loading and adapting to different size patients.

Figure 5:
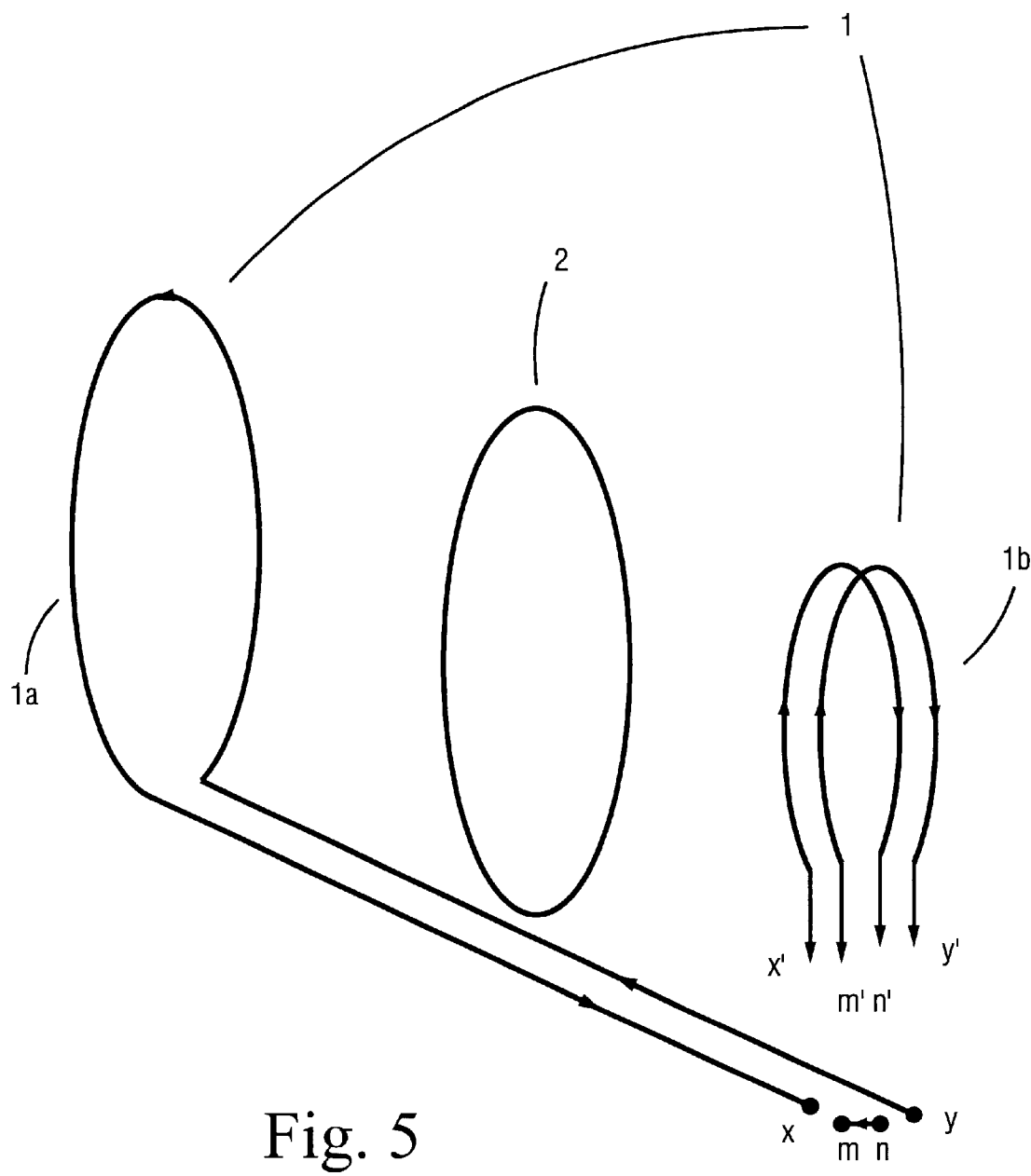
FIG. 5 is a schematic diagram illustrating a sandwiched solenoidal array coil with the gradient-field coil of the array having solenoidal sections of unequal diameters and corresponding different conductive windings in accordance with an alternate embodiment of the present invention.

In another embodiment of the SSAC shown in FIG. 5, the basic sandwiched solenoidal array of the present invention is configured such that loop (or solenoidal) sections 1a and 1b of coil 1 each have different diameters and a corresponding different number of turns (i.e., conductive windings). Although this particular embodiment of the SSAC is contemplated primarily for allowing the simultaneous imaging of both the head and the neck of a patient lying supine in a vertical-field MRI system, it can readily be adapted for imaging other portions of the anatomy which may be similarly disparate in size.

Since the human neck is smaller in diameter than the head, a smaller diameter solenoidal section 1b is designed for placement around the neck in close proximity to the neck tissues to improve sensitivity. However, since coil section 1b is smaller in diameter than coil section 1a, more conductive windings (turns) are needed in section 1b to maintain a balanced magnetic flux linkage with coil section 1a. For example, as depicted in FIG. 5, a smaller diameter multiple-turn detachable loop section is contemplated for the neck section 1b of coil 1. A larger diameter coil section 1a and the large diameter "sandwiched" coil 2 are designed to fit over the head of the patient. In practice, after a patient is fitted with head section 1a and coil 2 of the SSAC, the detachable neck section 1b can be fitted over the patient and then reconnected to coil 1, as indicated in FIG. 5 by the corresponding lettered indicia.

Figure 6:
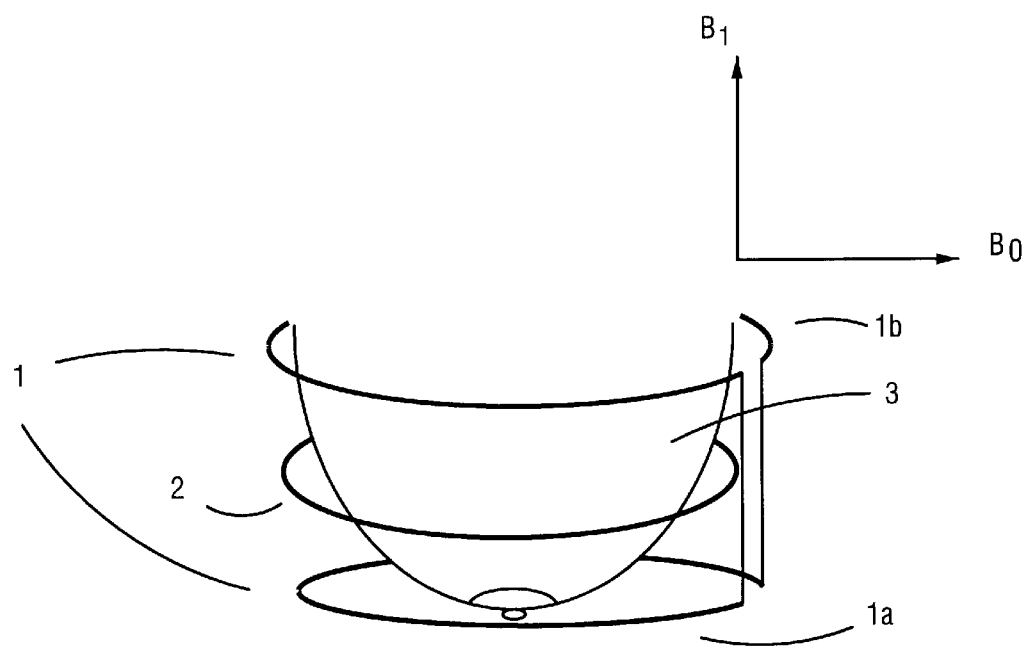
FIG. 6 is a schematic diagram illustrating a sandwiched solenoidal array coil used for breast imaging in a horizontal field MRI apparatus in accordance with an alternate embodiment of the present invention.

The basic sandwiched solenoidal array coil of the present invention also has practical applications in horizontal-field MRI systems. For example, an SSAC embodiment contemplated for imaging the human breast in a horizontal-field MRI apparatus is illustrated in FIG. 6. In this embodiment, a basic SSAC comprising coils 1 and 2 is fitted over and surrounds the breast of a prone patient laying in an MRI apparatus. Sandwiched coil 2 of the SSAC surrounds the center portion of breast 3 while sections 1a and 1b of coil 1 surround the upper and lower portions. In this manner, the RF magnetic field axis $\vec{B}_1$ of the SSAC is oriented vertically within the horizontal $\vec{B}_0$ field of the MRI apparatus, as indicated in FIG. 6 by the accompanying vector diagram. Although not shown, coils 1 and 2 of the SSAC are connected to appropriate input data acquisition channels of the horizontal-field MRI system for combining and processing. Lower solenoidal section 1a of coil 1 could also be configured to have a smaller diameter than upper section 1b so that it can fit closer against the breast tissues. In that case, as in the previous embodiment, additional conductive windings (turns) would be needed in the smaller diameter section to improve signal strength and to balance the magnetic flux with section 1b.

Figure 7A:
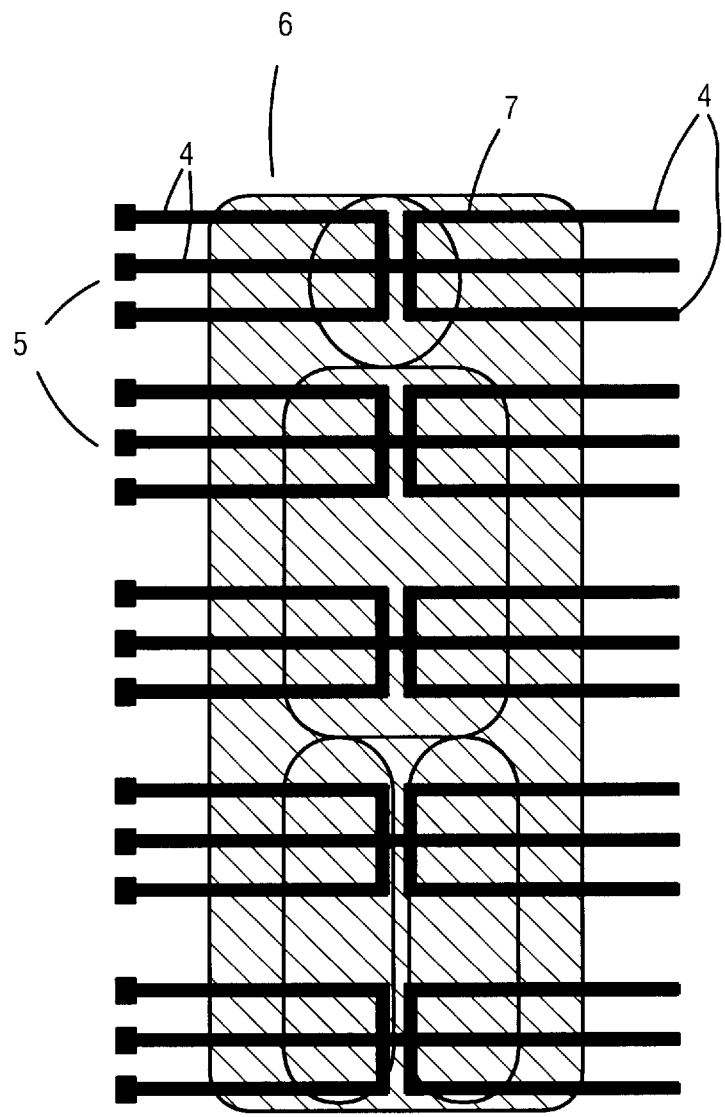
FIG. 7A is a schematic diagram illustrating a region-selectable multiple SSAC arrangement in accordance with an alternate embodiment of the present invention.

In accordance with another aspect of the present invention. FIG. 7A shows an anatomic-region selectable whole-body coil. In this embodiment, a multiple SSAC laden "blanket" 6 is designed for wrapping around a supine patient in a vertical-field MRI system. The blanket is preferably made up of a soft flexible electrically-insulating material that has sets of conductors embedded to form SSAC at multiple positions along the length of the blanket when properly connected. The array coils in the blanket provide NMR signals from distinct major portions of a patient, e.g., head, chest, abdomen, legs and feet.

Figure 7B:
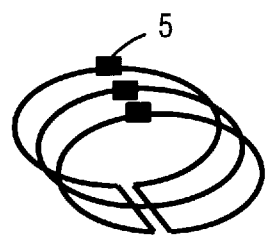
FIG. 7B is a schematic diagram illustrating a single SSAC of the multiple SSAC of FIG. 8A, shown with the connector buckle fastened in a closed connected position.

Exposed coil conductor portions 4 serve as flexible "belts" for fastening blanket 6 around a patient and each belt is provided with a conductive "buckle" or similar connector 5. Each set of embedded conductors forming an array coil is also provided with a circuitry and cable (not shown) for delivering NMR signal to data acquisition channels of the MRI apparatus. In this manner, each set of embedded conductors forms an array coil that aligns with a different anatomical region of a patient which can then be selected for imaging by fastening the buckle connectors corresponding to conductive belts of an appropriately positioned SSAC, as illustrated in FIG. 7B.

Figure 8:
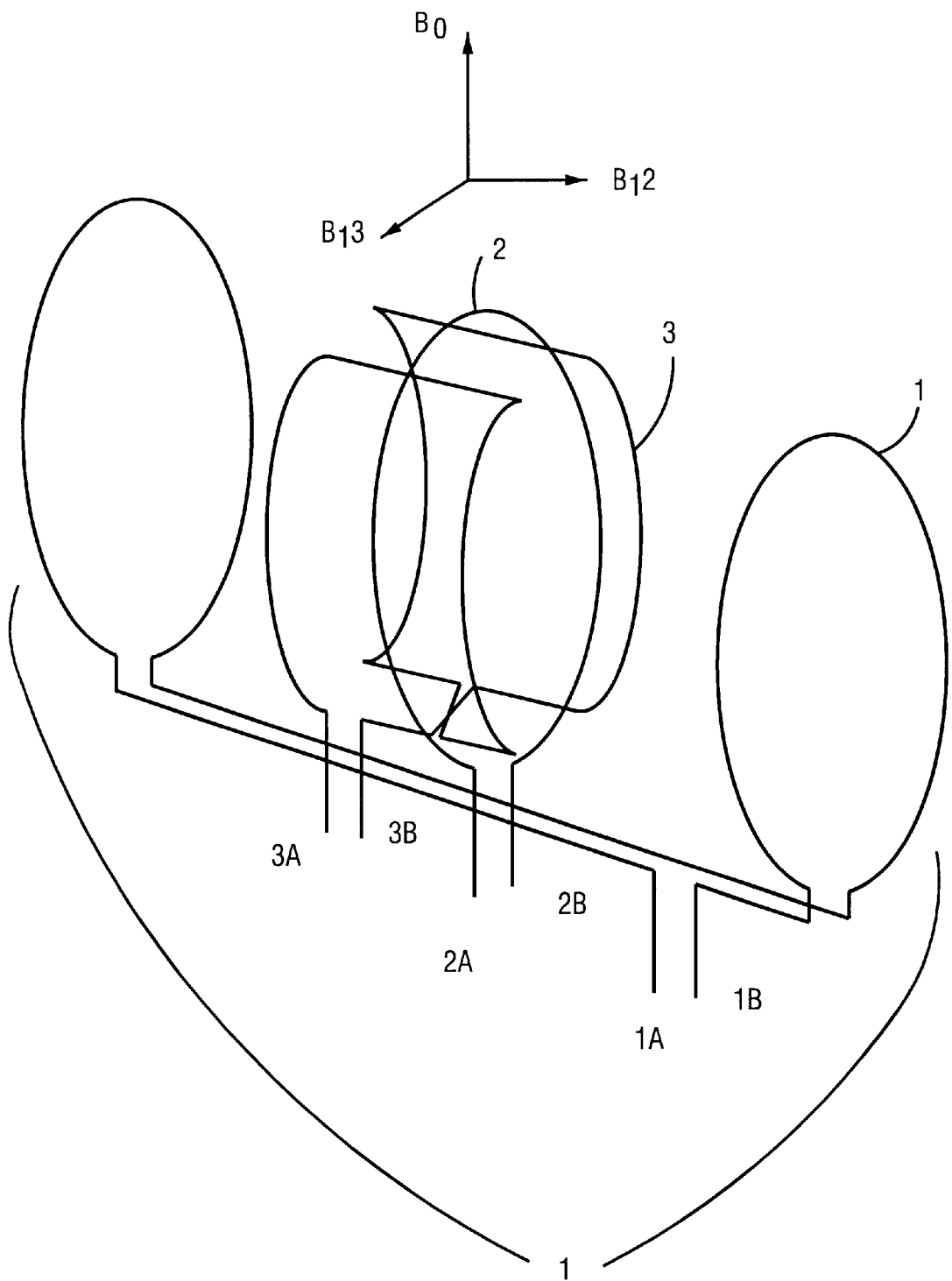
FIG. 8 is a schematic diagram illustrating a quadrature detection type sandwiched solenoidal array coil in accordance with an alternate embodiment of the present invention.

In an alternate embodiment of the present invention, shown in FIG. 8, a quadrature detection (QD) arrangement is provided by incorporating a saddle coil(s) into the basic SSAC. Saddle coil 3 is co-axially oriented with respect to coil 2 and is centrally located along with coil 2 between the two loop (or solenoidal) sections of coil 1. As illustrated by FIG. 8, the direction of the RF magnetic field, $\vec{B}_1$ 3, of saddle coil 3 and the direction of the RF magnetic field, $\vec{B}_1$ 2, of loop coil 2 are orthogonal to each other and to the static main field, $\vec{B}_0$, of the MRI apparatus, as indicated by the accompanying magnetic vector diagram. Therefore, coils 2 and 3 form a quadrature detection configuration. A magnetic flux analysis of this arrangement reveals that coils 1 and 2 are electromagntically de-coupled just as in the basic SSAC. In addition, due to the geometric symmetry of the arrangement, saddle coil 3 is magnetically de-coupled from both coil 1 and coil 2 because its $\vec{B}_1$ field is orthogonal to the $\vec{B}_1$ fields those coils. Any minor residual magnetic coupling between coil 3 and either of coils 1 or 2 can be compensated using a conventional capacitive de-coupling circuit.

As previously mentioned, the imaging "field-of-view" (FOV) for an MRI receive coil is conventionally defined as the distance between two points on the sensitivity profile curve where the signal drops to 80% of its peak value. Usually, a coil having a large FOV is preferable when attempting to produce an image that will cover a large region or volume of interest. However, a large FOV is not particularly desirable when attempting to obtain an image from just a small region or volume because it results in image data "fold-over" problems that can lead to improper image interpretation. Accordingly, the sandwiched solenoidal array coil of the present invention also permits FOV switching, i.e., switching between a large FOV and a small FOV, without time penalty in image data acquisition. This means one can reconstruct images with larger FOV or smaller FOV at the time of data processing, after image data from each channel is acquired simultaneously.

Figure 9A:
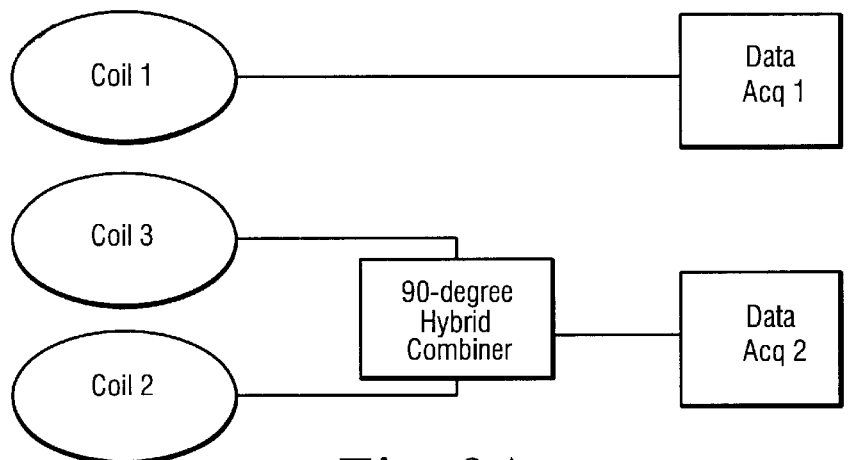
FIGS. 9A–9C are schematic diagrams illustrating three different data acquisition arrangements for the quadrature detection SSAC embodiment of the present invention.
Figure 9B:
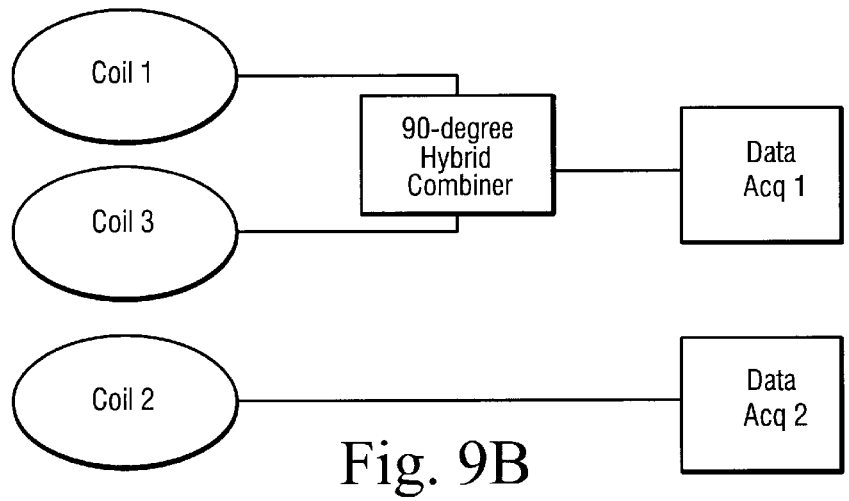

In accordance with another aspect of the present invention, a multi-element (multiple coil) SSAC can be used in either an "array mode" for obtaining simultaneous signal acquisition from each coil in the array or in a "selectable channel" mode for obtaining a signal from a single coil or a selected number of coils defining a single data acquisition channel in the array. For example, using the quadrature detection embodiment of the present invention shown in FIG. 8, simultaneous signal acquisition from three coils can be accomplished using a two-channel arrangement, as shown in FIGS. 9A & 9B. Considering first the arrangement of FIG. 9A, NMR signals picked up by coil 1 are processed via a first data acquisition channel 1. At the same time, NMR signals acquired from coils 2 and 3 are combined using a 90° hybrid combiner and processed via a second data acquisition channel 2. A limited FOV can be obtained from channel 2 alone or an image having a larger FOV can be obtained by combining signal data from both channel 1 and channel 2. A multi-element embodiment of the SSAC thus provides the ability to switch between either a large FOV or a small FOV to avoid image fold-over problems.

Figure 9C:
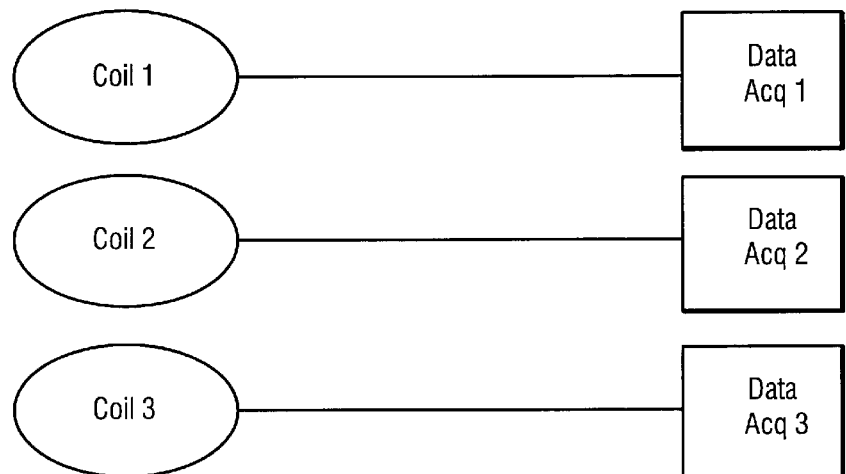

Similarly, other multi-channel signal acquisition and processing arrangements are possible utilizing a multi-element SSAC embodiment of the present invention. For example, instead of combining the signals from coils 2 and 3 into a single channel, the signals from coils 1 and 3 can be combined, as illustrated in FIG. 9B. Moreover, if a third data processing channel is desirable, the signals from each of the three coils can be acquired separately in independent channels, as illustrated in FIG. 9C. In addition, each of these signal processing arrangements will still retain the FOV size switching capability discussed above.

Figure 10A:
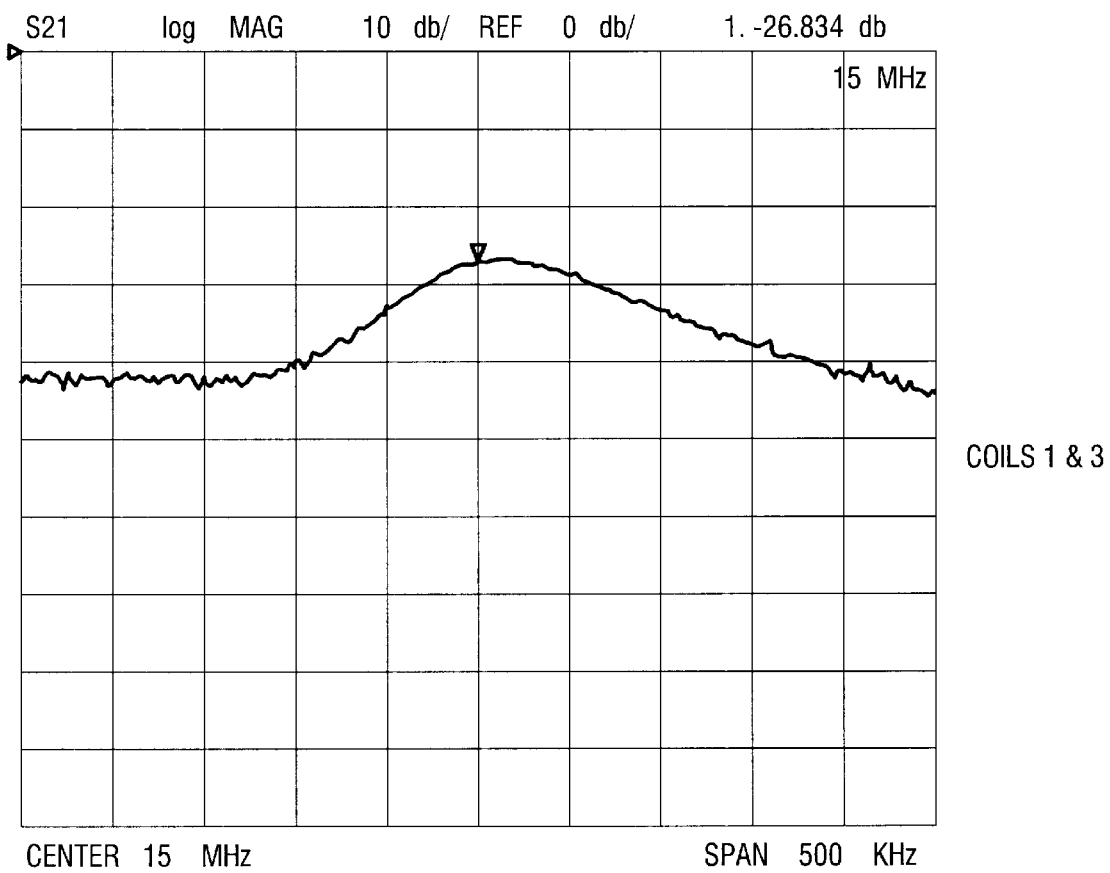
FIGS. 10A–10C are example graphs of the electromagnetic isolation obtainable between different coils in the quadrature detection SSAC embodiment in accordance with the present invention.
Figure 10B:
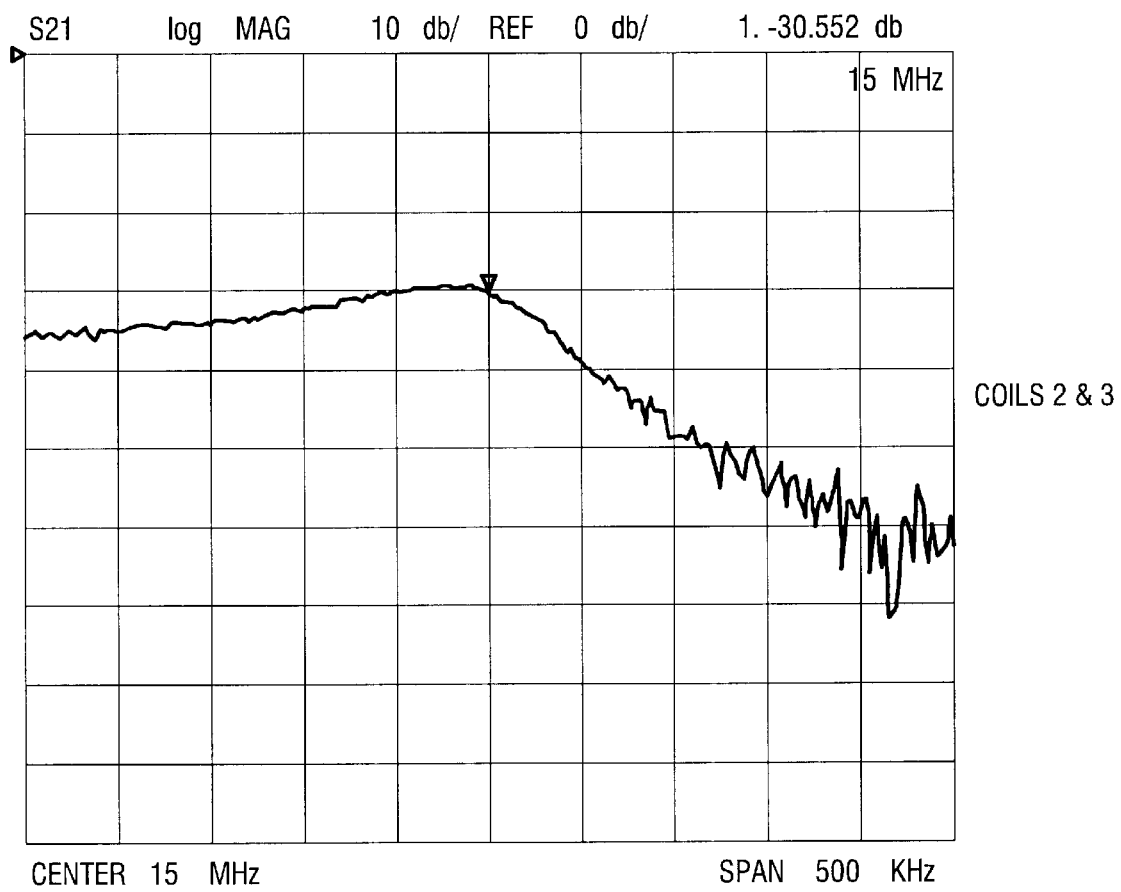
Figure 10C:
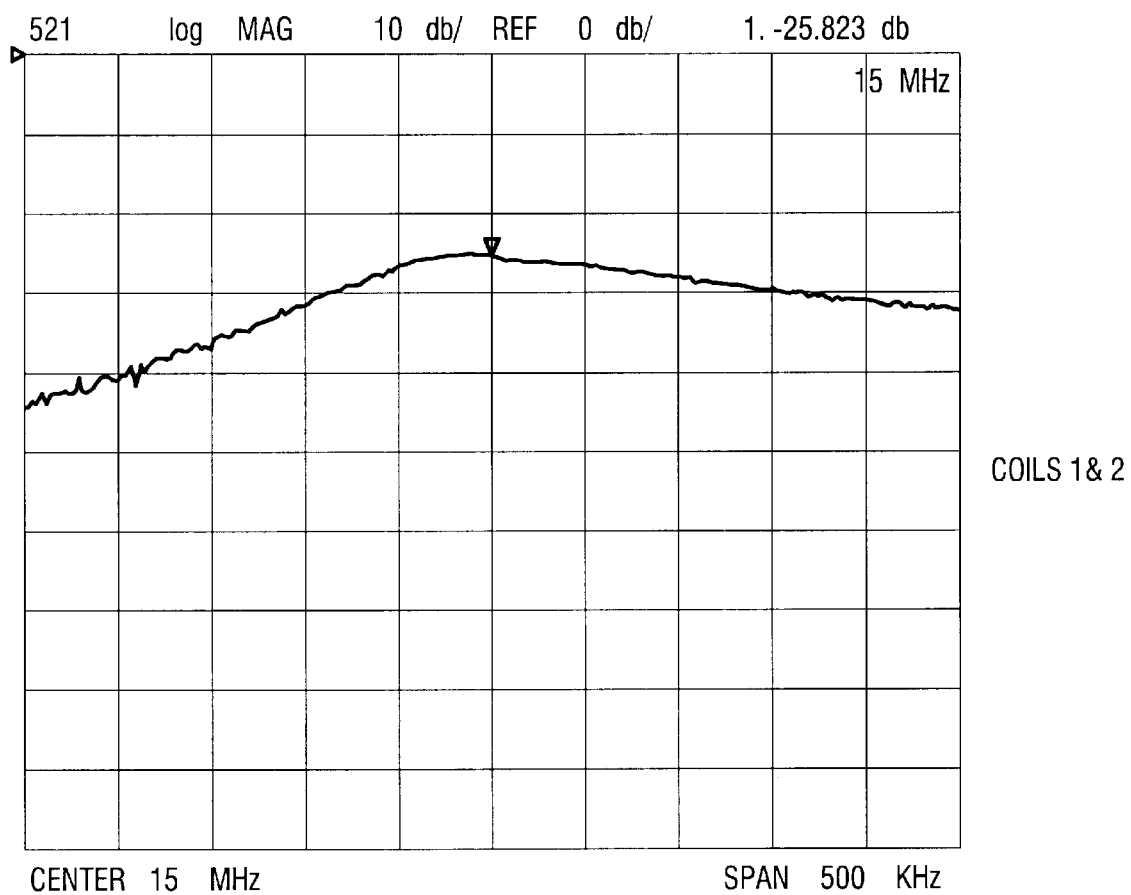

FIGS. 10A–10C are graphs representing the exemplary electromagnetic isolation between different coils in a quadrature detection SSAC constructed in accordance with the present invention. Each of the three coils in the QD SSAC is connected to its own tune and match circuit. Residual electromagnetic coupling between each coil pair is compensated using a variable de-coupling capacitor connected between each coil. The maximum isolation between coils is readily achieved by properly adjusting the variable de-coupling capacitor. The curves shown in FIGS. 10A–10C represent the S21 parameter using a conventional network analyzer with the SSAC coils tuned at 15 MHz. FIGS. 10A, 10B and 10C illustrate that exemplary electromagnetic isolations between coils are: −26 dB, −30 dB and −25 dB for coil 1: coil 3, coil 2: coil 3 and coil 1: coil 2, respectively.

Figure 11A:
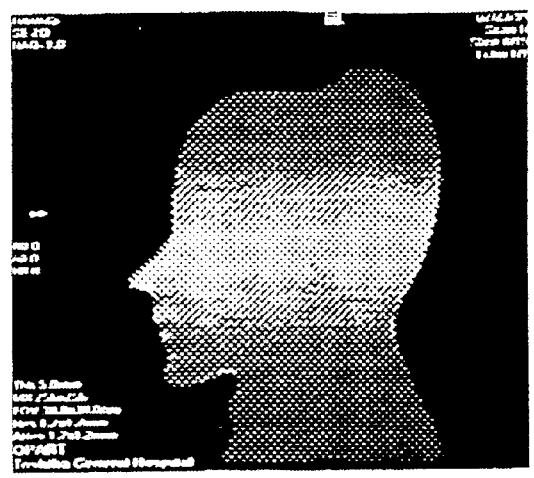
FIGS. 11A–11C are head phantom images respectively acquired from a quadrature detection coil pair, an RF gradient coil and the basic SSAC of the present invention.
Figure 11B:
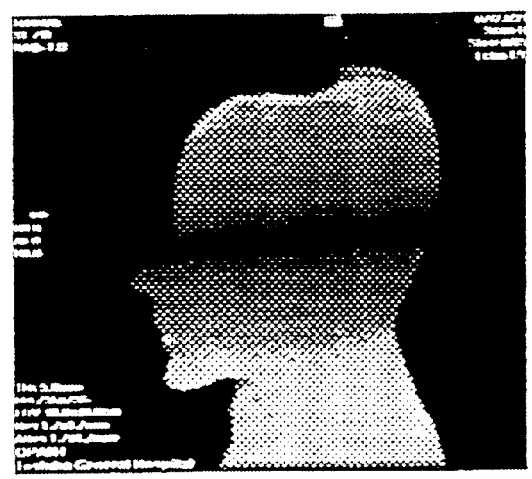
Figure 11C:
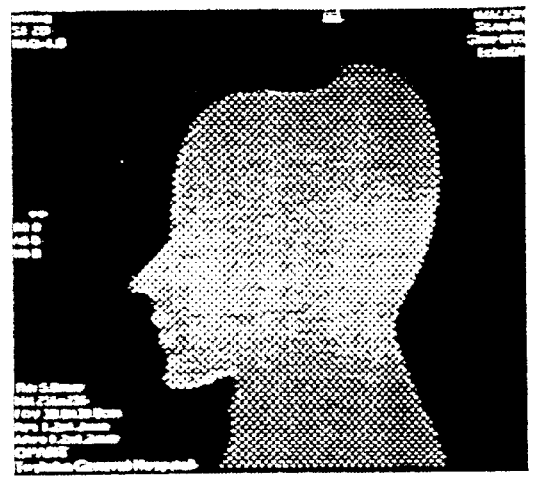

FIGS. 11A–11C illustrate example phantom sagital human head images obtained using the quadrature detection SSAC embodiment of the present invention. To obtain these images, an SE 2D imaging sequence was performed using a Toshiba Opart vertical imaging system with TR=1000 milliseconds, TE=25 milliseconds, FOV=30 cm×30 cm, ST=5 mm and a pixel matrix of 256×256. FIG. 11A shows a sagital head phantom image constructed from signals acquired using coils 2 and 3 as a quadrature detection pair alone; FIG. 11B shows a sagital head phantom image constructed from signals from gradient-field coil 1 alone; and FIG. 11C shows a sagital head phantom image constructed from the weighted sum of the two signals together. The quadrature detection image of FIG. 11A shows a region of strong signal (i.e., the brightest pixels) at the center of the image, whereas the gradient-field coil image of FIG. 11B shows the strongest signal at the upper and lower edges away from the center. As evidenced by FIG. 11C, the image of the weighted sum of the two signals together, produced by the SSAC arrangement of the present invention, has a much more uniform pixel intensity throughout than images from either a quadrature detection coil pair or a gradient-field coil alone.

Figure 12A:
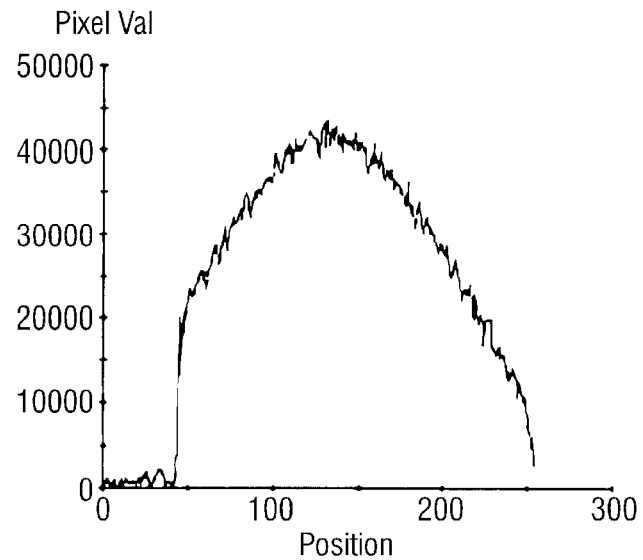
FIGS. 12A–12C are graphs of pixel signal intensity using pixel data corresponding to the center line, in the superior-inferior direction, from the image data corresponding to FIGS. 11A, 11B and 11C, respectively.
Figure 12B:
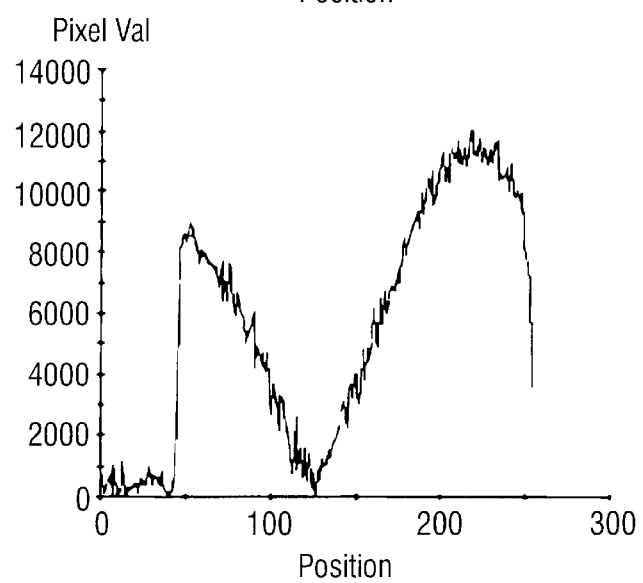
Figure 12C:
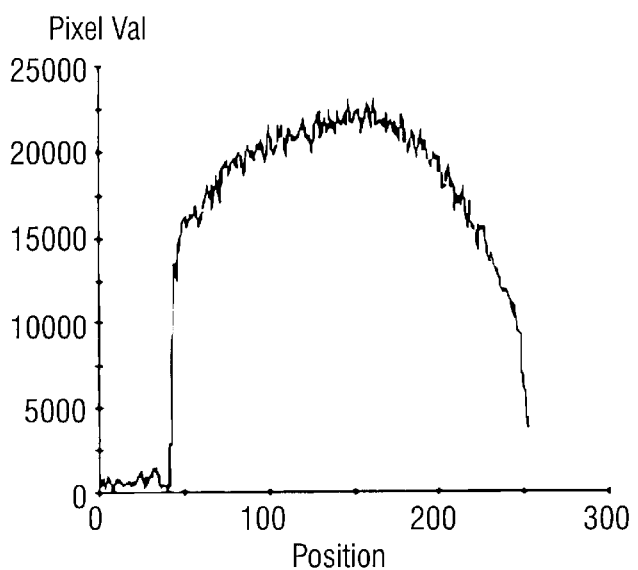

FIGS. 12A–12C illustrate the image signal amplitude (pixel intensity) profiles corresponding to data from FIGS. 11A, 11B and 11C, taken from the middle of the respective images, in a superior-inferior direction. The quadrature detection coil pair alone provides an FOV of about 11 centimeters, whereas the quadrature detection SSAC configuration of the present invention provides an FOV of about 17.5 centimeters. Moreover, an even larger FOV may be produced by increasing the separation, W, between each of the two solenoidal sections of the gradient-field coil of the SSAC.

Figure 13:
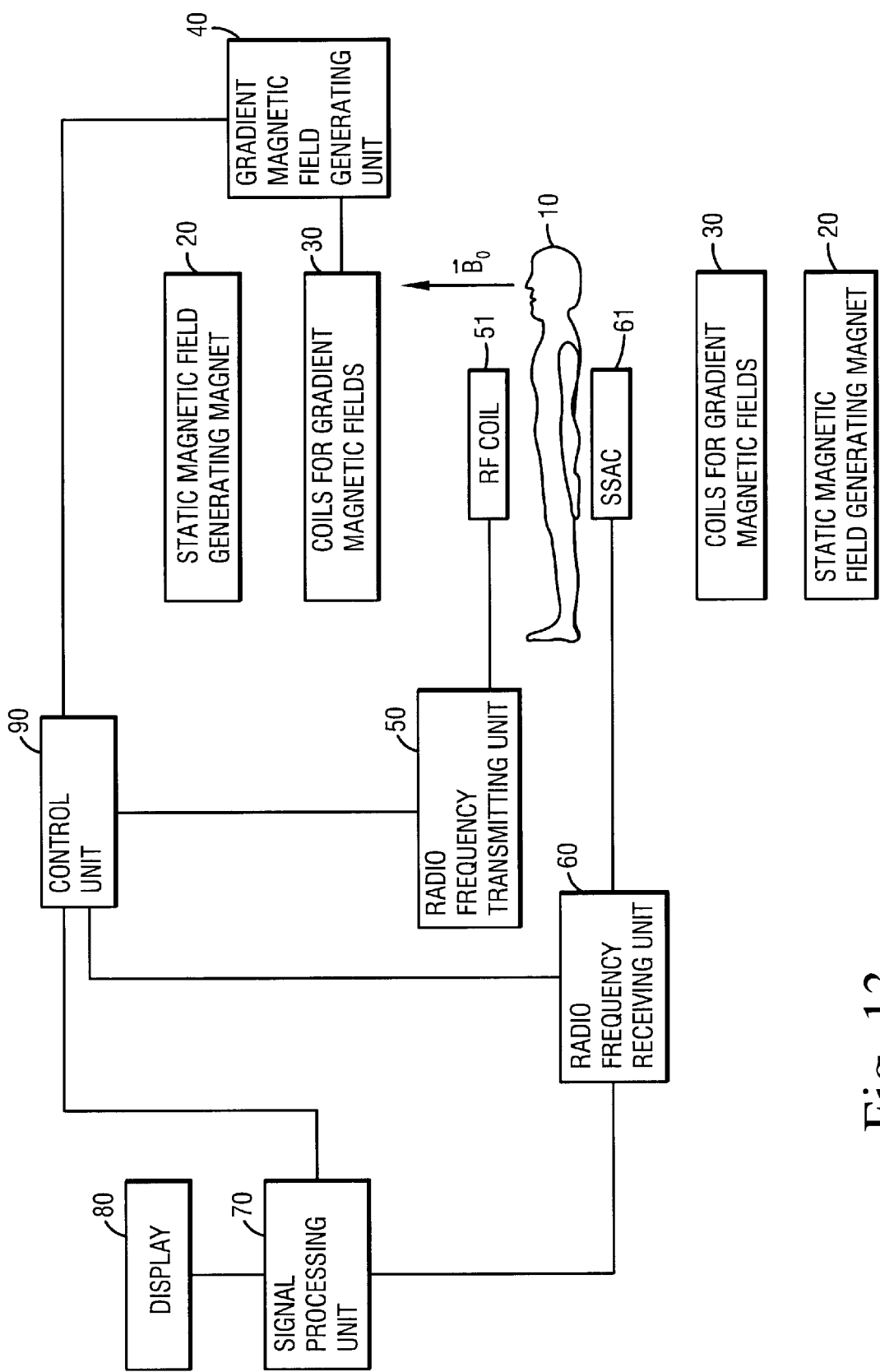
FIG. 13 is a schematic block diagram representation of an example MRI system which employs the present invention.

Referring now to FIG. 13, a general configuration of the major components common to a conventional vertical-field MRI system which employs the SSAC of the present invention is briefly discussed. A horizontal-field MRI system which may also utilize the SSAC of the present invention contains the same basic components as the vertical-field system shown, but is structurally configured such that the main static polarizing magnetic field, $\vec{B}_0$, is created substantially parallel to the plane of the ground. Typically, an MRI system comprises a large superconducting magnet 20 for generating a strong static polarizing magnetic field, an electromagnet coil arrangement 30 for producing large gradient magnetic fields, a gradient magnetic field pulse generating unit 40, a RF transmitting unit 50 for producing an RF excitation pulse, a radio frequency receiving unit 60 for receiving NMR signals, a signal processing unit 70, a display device 80 and a control unit 90 for controlling operation and timing of all the associated units in the system.

The static main field generating magnet 20 is arranged in a space surrounding patient 10 and provides a powerful uniform vertical (or horizontal) magnetic field through the patient. An output of the gradient magnetic field generating unit 40 is sent to the coil array 30 for producing three gradient magnetic fields $G_x$, $G_y$ and $G_z$ corresponding to X, Y and Z mutually orthogonal directions. An RF pulse generated by radio frequency transmitting unit 50 is provided to RF coil 51 for transmitting an nuclei excitation pulse into the tissues of patient 10. The resulting radio frequency nuclear magnetic resonance (NMR) signals from patient 10 are detected by radio frequency receiving unit 60 after being picked-up by RF receive coil 61. The preferred structural arrangements for RF receive coil 61 include the above discussed example SSAC embodiments of the present invention—which are readily movable and may be placed on or positioned over specific areas of the patient's body.

Control unit 90 regulates the timing and application of the gradient magnetic fields and the transmission and reception of RF signals to RF coils 51 and 61, respectively. An NMR signal output from radio frequency receiving unit 60 is stored and subjected to Fourier transform analysis by signal processing unit 70 in a manner well known in the art to produce image information for displaying on display unit 80.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A region-selectable sandwiched solenoidal array coil for imaging the torso of a patient utilizing an MRI apparatus, comprising:

a sheet of flexible electrically insulating material having one or more embedded conductors for forming a plurality of sandwiched solenoidal array coils, each sandwiched solenoidal array coil comprising a plurality of array coil elements wherein at least one coil element is a solenoidal loop sandwiched between a pair of solenoidal loop coil sections, wherein such sandwiched solenoidal array coils are formed surrounding the patient at selected positions along the length of the sheet when the sheet is wrapped around the torso of a patient and conductor portions thereof are selectively connected together.

2. A region-selectable sandwiched solenoidal array coil as set forth in claim 1, wherein conductor portions include a conductive belt portion and a conductive buckle portion for electrically and structurally connecting embedded conductor portions together.

3. A region-selectable sandwiched solenoidal array coil as set forth in claim 1, wherein the sheet comprises two or more laminated layers of material and contains conductors between laminated layers.

4. A region-selectable sandwiched solenoidal array coil as set forth in claim 1, wherein the sheet forms a blanket.

* * * * *